(12) United States Patent
De Ruijter (10) Patent No.: US 7,689,189 B2
(45) Date of Patent: Mar. 30, 2010

(54) CIRCUIT AND METHOD FOR SIGNAL RECEPTION USING A LOW INTERMEDIATE FREQUENCY RECEPTION

(75) Inventor: Hendricus C. De Ruijter, Sunnyvale, CA (US)

(73) Assignee: Silicon Laboratories Inc., Austin, TX (US)

( * ) Notice: Subject to any disclaimer, the term of this patent is extended or adjusted under 35 U.S.C. 154(b) by 814 days.

(21) Appl. No.: 11/398,991

(22) Filed: Apr. 6, 2006

(65) Prior Publication Data

US 2006/0229052 A1 Oct. 12, 2006

Related U.S. Application Data

(60) Provisional application No. 60/668,637, filed on Apr. 6, 2005, provisional application No. 60/668,922, filed on Apr. 6, 2005.

(51) Int. Cl.
*H04B 1/10* (2006.01)

(52) U.S. Cl. .................... 455/213; 455/67.13; 455/203; 455/324; 375/136; 375/332; 375/334

(58) Field of Classification Search ................. 455/203, 455/213, 324, 67.13; 375/332–334, 136
See application file for complete search history.

(56) References Cited

U.S. PATENT DOCUMENTS

| 2,379,748 | A | | 7/1945 | Roberts ...................... 329/315 |
|---|---|---|---|---|
| 2,926,316 | A | | 2/1960 | Rae-Fraser .................. 333/177 |
| 4,193,033 | A | * | 3/1980 | Voorman ..................... 375/334 |
| 4,193,035 | A | * | 3/1980 | Berger ........................ 455/203 |
| 5,017,841 | A | | 5/1991 | Miura |
| 5,091,921 | A | * | 2/1992 | Minami ...................... 375/334 |
| 5,341,107 | A | | 8/1994 | Bijker et al. |

(Continued)

FOREIGN PATENT DOCUMENTS

WO      WO 01/39385      5/2001

OTHER PUBLICATIONS

H. van Rumpt, W.G. Kasperkovitz and J van der Tang, "A digitally programmable zero external components FM radio receiver with 1 uV sensitivity," ISSCC 2003.

(Continued)

*Primary Examiner*—Edward Urban
*Assistant Examiner*—Junpeng Chen
(74) *Attorney, Agent, or Firm*—O'Keefe, Egan, Peterman & Enders LLP (57) ABSTRACT

A method and circuit for receiving a radio frequency signal by receiving and amplifying the radio frequency signal to produce a received signal and generating first and second clock signals corresponding to first and second channel signals, respectively, of the received signal and multiplying the received signal with the clock signals to obtain the channel signals. Pre-selectivity filtering of the received signal is performed by filtering the first channel using a first impedance, filtering the second channel using a second impedance, and converting the first and second impedances with respect to one another through a first gyrator. Amplitude limiting of the first and second channels is performed to obtain first and second amplitude limited channels. Poly-phase selectivity filtering of the first and second amplitude limited channels is performed to obtain first and second selectivity filtered channels. The selectivity filtered channels are demodulated to obtain a data signal.

22 Claims, 6 Drawing Sheets

U.S. PATENT DOCUMENTS

| | | | |
|---|---|---|---|
| 5,697,093 A * | 12/1997 | Cusdin et al. | 455/324 |
| 6,184,747 B1 * | 2/2001 | Helgeson et al. | 327/552 |
| 6,233,431 B1 * | 5/2001 | Panther et al. | 340/7.28 |
| 6,545,569 B1 * | 4/2003 | Greer | 333/215 |
| 6,590,943 B1 * | 7/2003 | Ali | 375/332 |
| 7,292,092 B2 | 11/2007 | De Ruijter | |
| 7,405,613 B2 | 7/2008 | De Ruijter | 329/339 |
| 2001/0013807 A1 * | 8/2001 | Essink | 327/552 |
| 2003/0124981 A1 * | 7/2003 | Greer | 455/67.3 |
| 2004/0053590 A1 * | 3/2004 | Marholev | 455/213 |
| 2006/0126702 A1 * | 6/2006 | Burdett | 375/136 |

OTHER PUBLICATIONS

Gilbert, "A Precise Four-Quadrant Multipler With Subnanosecond Response", IEEE Journal Of Solid-State Circuits, vol. SC-3, No. 4, Dec. 1968, 9 pgs.

Leifso et al., "Monolithic Tunable Active Inductor With Independent Q Control", IEEE Transactions On Microwave Theory And Techniques, vol. 48, No. 6, Jun. 2000, 6 pgs.

WordIQ, Definition of Gyrator, Printed From Internet Oct. 14, 2004, 2 pgs.

Discover Circuits, "Converters: Frequency Circuits", Oct. 2, 2004, 1 pg.

Voorman etal., "Integration of Analog Filters in a Bipolar Process", IEEE Journal of Solid-State Circuits, vol. SC-17, No. 4, Aug. 1982, 10 pgs.

John Tomarakos, "Interfacing I2S-Compatiable Audio Devices To The ADSP-21065L Serial Ports", Application Note, Apr. 1999, 37 pgs.

Rectification Using A Gyrator Circuit, Printed From Internet Oct. 14, 2004, 2 pgs.

Girator, Printed From Internet Oct. 14, 2004, 1 pg.

Yang et al., "Fully Orthogonal Multi-Carrier Predistortion Linearization & Soft Crest Factor Reduction Technique", Jan. 29-30, 2009, 11 pgs.

Hastings, "An Introduction To Matching And Layout", Texas Instruments, 21 pgs.

"Matching Of Resistors And Capacitors", 46 pgs.

Hizlan, "FM Demodulation", Agilent Technologies, 4 pgs.

Forsseell, "The Evolution Of An EQ Design", Available Prior to the Apr. 6, 2006 Filing Date Of The Present Application, 9 pgs.

* cited by examiner

CIRCUIT AND METHOD FOR SIGNAL RECEPTION USING A LOW INTERMEDIATE FREQUENCY RECEPTION

CROSS-REFERENCE TO RELATED APPLICATION

This application claims priority to U.S. provisional application No. 60/668,637 entitled CIRCUIT AND METHOD FOR SIGNAL RECEPTION USING A LOW INTERMEDIATE FREQUENCY filed Apr. 6, 2005, and to U.S. provisional application No. 60/668,922 entitled DIFFERENTIAL SLOPE FM DEMODULATOR FOR LOW-IF FREQUENCIES filed Apr. 6, 2005, herein incorporated by reference in their entirety for all purposes. This application is related to commonly owned U.S. provisional application No. 60/668,922 entitled DIFFERENTIAL SLOPE FM DEMODULATOR FOR LOW-IF FREQUENCIES filed Apr. 6, 2005 and corresponding U.S. patent application Ser. No. 11/399,058, now U.S. Pat. No. 7,405,613, herein incorporated by reference in their entirety for all purposes.

FIELD OF INVENTION

The present invention relates to reception of a data signal and, more specifically, to signal reception using an intermediate frequency (IF).

BACKGROUND OF THE INVENTION

The cost and size of a single chip receiver can be reduced when the receiver's selectivity filter and the demodulator are completely integrated on the chip. To obtain reasonable power consumption, which is required for longer battery life, the intermediate frequency (IF) chosen for the receiver is typically relatively low, e.g. 200 kHz.

In general, the image reception is suppressed by a combination of a quadrature mixer and a poly-phase filter. The low IF outputs (the I and Q channel) of the quadrature mixer are connected to the input of a poly phase selectivity filter that inherently suppresses the image frequency. The first stages of the poly phase filters are soft-clipping amplifiers to prevent non linear distortion, such as AM to PM conversion, caused by large signals that exceed the linear range of the integrated poly phase filter. Alternatively, the soft-clipping amplifier may be replaced with an automatic gain controlled front-end. Examples of such architectures are found in Brian J. Minnis and Paul A. Moore, "Improvements in or relating to poly phase receivers," PCT application no. WO 01/39385 A1, May 31, 2001 ("Minnis et al."), and H. van Rumpt, W. G. Kasperkovitz and J van der Tang, "A digitally programmable zero external components FM radio receiver with 1 uV sensitivity," ISSCC 2003 ("van Rumpt, et al."). In a circuit implementation, it is common practice to implement a pre-selectivity filter (e.g. a first order, low-pass filter) immediately following the mixer outputs to create some selectivity before the signal enters the poly phase selectivity filter.

The cut-off frequency of these pre-selectivity filters needs to be at least IF+(Bw/2), where Bw is the signal bandwidth. On the image side, however, these low-pass filters will not reduce the interference up to 2*IF+(Bw/2) frequency distance from the receive channel. The dynamic range of the poly phase filters needs to be high enough to cope with the unfiltered interference at the image side.

SUMMARY OF THE INVENTION

In one embodiment of a low intermediate frequency receiver, according to one aspect of the present invention, the receiver includes an amplifier having an input for receiving a radio frequency signal and an output for outputting the received signal. The receiver also includes a local oscillator having a first output for providing a first clock signal corresponding to a first channel of the received signal and a second output for providing second clock signal corresponding to a second channel of the received signal. A quadrature mixer has an input coupled to the output of the amplifier, a first clock input coupled to the first output of the local oscillator, and a second clock input coupled to the second output of the local oscillator, such that the received signal is input to the quadrature mixer along with the first and second clock signals and, responsive thereto, the quadrature mixer outputs the first channel signal at a first output and the second channel signal at a second output. The first and second outputs of the quadrature mixer are coupled to a pre-selectivity filter configured to remove an image channel from the first and second channel signals. The first output of the quadrature mixer is further coupled to a first amplitude limiter circuit and the second output of the quadrature mixer is further coupled to a second amplitude limiter circuit. Outputs of the first and amplitude limiter circuits are coupled to inputs of a selectivity filter circuit. An output of the selectivity filter circuit is coupled to a demodulator. The pre-selectivity filter further comprises a first resistive-capacitor network coupled to the first output of the quadrature mixer and a second resistive-capacitor network coupled to the second output of the quadrature mixer, where the first and second resistive-capacitor networks are coupled together through a gyrator. In a further refinement of this embodiment, the selectivity filter is a poly-phase selectivity filter further that includes gyrator resonator type poly-phase filter elements. In still another refinement of this embodiment, the poly-phase selectivity filter uses the same type of devices as the gyrator resonator and the amplitude limiter further comprise soft clippers that include transconductors that are the same type of device and topology as is used in the quadrature mixer.

In an embodiment of a method, according to the present invention, for receiving a radio frequency signal, the radio frequency signal is received and amplified to produce a received signal. First and second clock signals are generated, where the first clock signal corresponds to a first channel of the received signal and the second clock signal corresponds to a second channel of the received signal. The received signal is mixed with the first and second clock signals to obtain the first and second channel signals. The first channel signal is pre-selectively filtered using a first impedance and the second channel signal is pre-selectively filtered using a second impedance. The first and second channel signals are then amplitude limited and the amplitude limited first and second channel signals are selectively filtered. The selectively filtered first and second channel signals are then demodulated to obtain a data signal. The first and second impedances are converted with respect to one another through the use of a gyrator effect.

BRIEF DESCRIPTION OF THE DRAWINGS

Certain embodiments of the present invention are described below with reference to the following drawings wherein.

DETAILED DESCRIPTION OF THE PREFERRED EMBODIMENTS

A method and circuit for low intermediate frequency reception is shown that utilizes gyrator resonator pre-selectivity filtering of a received image so that subsequent elements may operate with reduced dynamic range. In a different aspect of the present invention, gyrator resonator type poly-phase filter elements are used in the receiver to obtain accurate and substantially temperature independent matching of center frequency and bandwidth.

The invention is based on the insight that the pre-selectivity filtering can be much more effective when poly phase filtering is merged into a quadrature mixer implementation in a manner described below. One aspect of the present invention is to provide filtering in a more effective way so that the dynamic range requirements of the poly phase IF filter can be relaxed, which may permit power consumption and chip area to be reduced.

Figure 1:
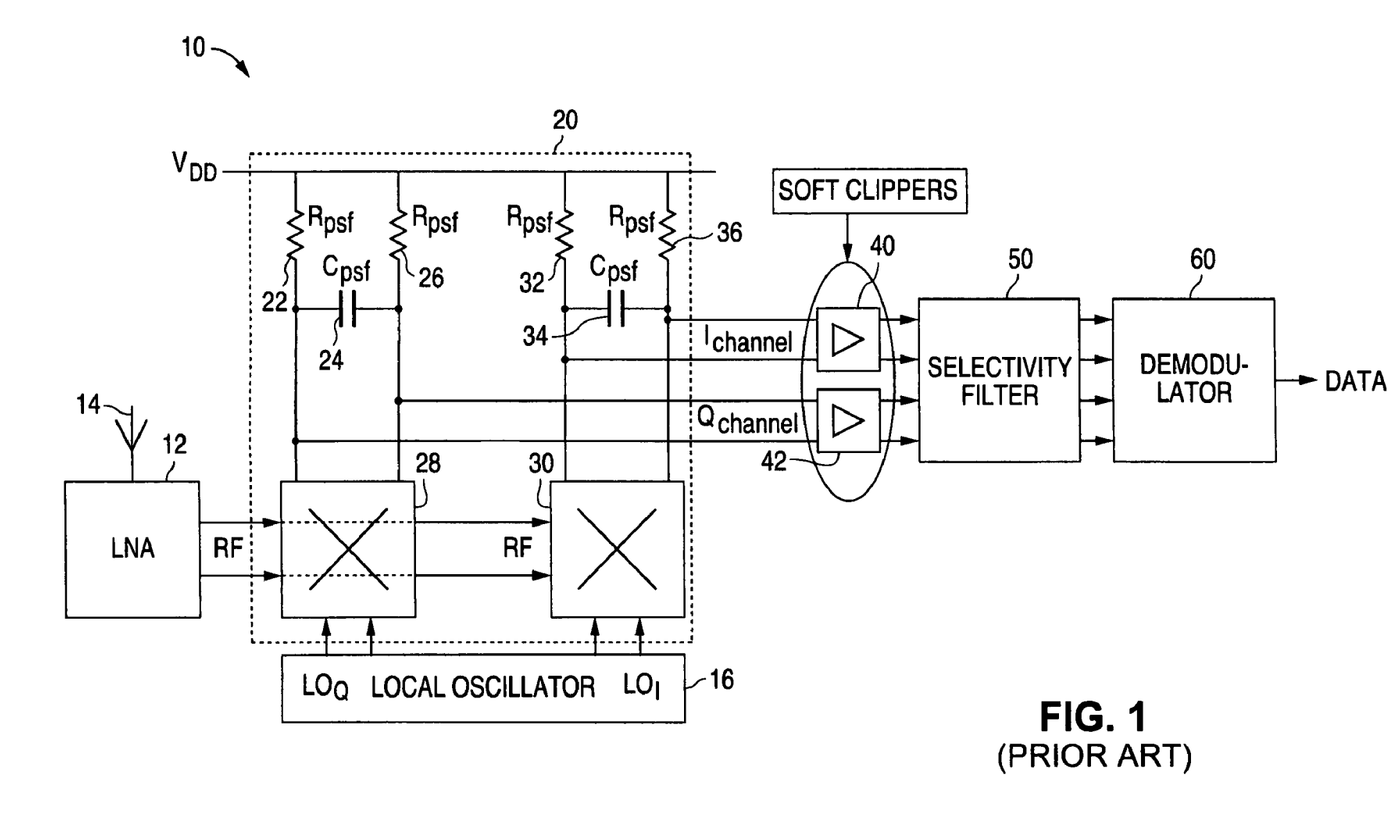
FIG. 1 is a functional block diagram illustrating an example of a conventional low IF receiver circuit.

An example of a common implementation of a low-IF receiver, such as those taught by Minnis et al. and van Rumpt et al., is sketched in FIG. 1. In this example, the signal connections are drawn as differential signals.

FIG. 1 is a functional block diagram illustrating an example of a conventional low IF receiver circuit 10, such as those described by Minnis, et al. and van Rumpt, et al. A low noise amplifier 12 receives a radio frequency (RF) signal via an antenna 14. Amplifier 12 outputs a differential RF signal that is input to a quadrature mixer circuit 20, where the RF signal is input to multipliers 28 and 30 to obtain an I channel and a Q channel from the received signal. Local oscillator 16 provides an I channel local oscillator signal $LO_I$, which is input to multiplier 30, and a Q channel local oscillator signal $LO_Q$, which is input to multiplier 28. The local oscillator 16 is tuned to the desired channel frequency plus or minus the Intermediate Frequency (IF) and produces the in-phase ($LO_I$) and quadrature-phase ($LO_Q$) outputs. The output of multiplier 28 is subject to pre-selectivity filtering by the combination of resistors 22 and 26 with capacitor 24. Likewise, the output of mixer 30 is subject to pre-selectivity filtering by the combination of resistors 32 and 36 with capacitor 34. The resulting I and Q channels are input to soft clippers 40 and 42, which are amplitude limiters that limit the maximum amplitude of the channel signals, and then input to poly-phase selectivity filter 50. The output of poly-phase selectivity filter 50 is input to demodulator 60, which outputs the received data signal.

Most multipliers have current outputs, e.g. a Gilbert multiplier is commonly used. See "A Precise Four Quadrant Multiplier with Subnanosecond Response," Barrie Gilbert, IEEE Journal of Solid State Circuits, Vol. SC-3, No. 4, December 1968. This current output is transformed to a voltage and high frequency components are filtered by the $R_{psf}$-$C_{psf}$ combinations. In this example, this filter is called a "pre-selectivity filter".

Figure 2:
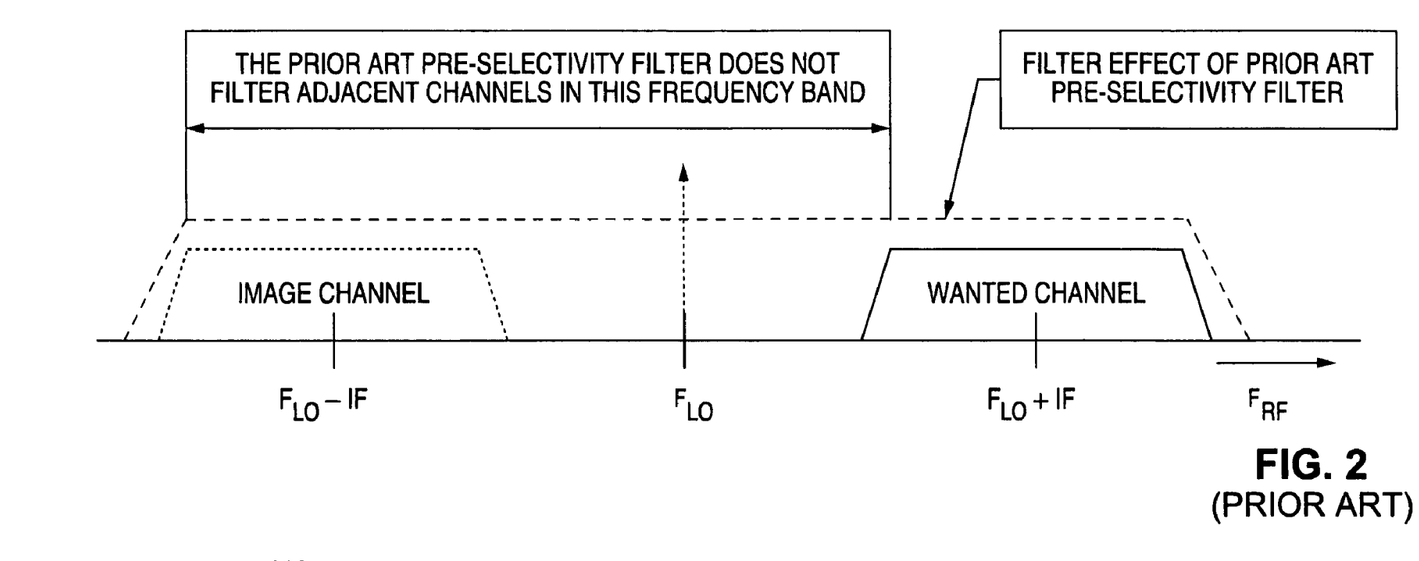
FIG. 2 is a frequency response diagram illustrating the frequency response of the mixer and pre-selectivity filter of FIG. 1.

The result of this mixing process is that the RF signal is transposed to an IF signal obtained at the output of the Quadrature Mixer 20 in both the in-phase I channel and quadrature-phase Q channel. The limitation of the typical prior art pre-selectivity filtering approach is illustrated in the frequency response diagram of FIG. 2. FIG. 2 is a frequency response diagram illustrating the filer limitation of the conventional pre-selectivity filtering of FIG. 1. In FIG. 2, the local oscillator frequency is $F_{LO}$, the desired channel appears at $F_{LO}$+IF, and the image channel appears at $F_{LO}$−IF.

In the conventional approach, no image suppression occurs at the output of the mixer 20. Adjacent channels that are present at the image site are passed right through to the soft clippers without any filtering up to a frequency distance (with respect to the center of the wanted channel) of 2*IF+(Bw/2). Consequently, the dynamic range of the successive soft clippers and poly-phase filters needs to be sufficiently high to filter the image. Because the image is still present, greater dynamic range is required in order to filter the image, which results in a circuit that requires greater supply current.

Another potential problem that may be associated with the conventional approach is that this asymmetrical filtering leads to an asymmetrical receive channel. The succeeding circuitry needs to be adapted to accommodate the asymmetrical channel, which leads to sub-optimal receiver design. Examples of potential problems caused by asymmetry in the receive channel are generation of second order distortion products and an increase of inter-symbol interference.

Still another potential problem that may be associated with the conventional approach is that the adjacent selectivity performance on the image side completely depends on the poly-phase selectivity filter 50. The pre-selectivity filter within quadrature mixer 20 has no selectivity contribution in the adjacent channels at the image side.

Yet another potential problem that may be associated with the conventional approach is that the IF signal has to pass through the soft clippers 40 and 42 before it enters the poly-phase selectivity filter 50. Due to phase and amplitude mismatch introduced by the soft clippers 40 and 42 and the associated interconnection to poly-phase selectivity filter 50, the I Q relationship is distorted, which will result in a degradation of image suppression.

One aspect of the present invention is to provide filtering in a more effective way so that the dynamic range requirements of the poly-phase IF filter can be relaxed. Power consumption and chip area may also be reduced.

A second aspect of the present invention is to obtain a receive channel that is completely symmetrical. This allows for a better design for the overall channel selectivity that potentially improves the receiver in terms of selectivity and distortion. At the same time, the receiver complexity can be reduced, since the impairments caused by asymmetry no longer require compensation provisions.

A third aspect of the present invention is to improve the intrinsic image suppression without the use of complex compensation loops.

The present invention is based on the insight that the pre-selectivity filtering can be much more effective when poly phase filtering is merged into the quadrature mixer implementation in the manner described below. In accordance with the present invention, by adding a gyrator resonator to the output of the mixers and pre-selectivity filter, the image channel can be suppressed before it is input to the soft clippers and selectivity filter of the receiver. Thus, the dynamic range of the selectivity filter may be reduced, which can lead to less current draw and reduced chip area.

Figure 3:
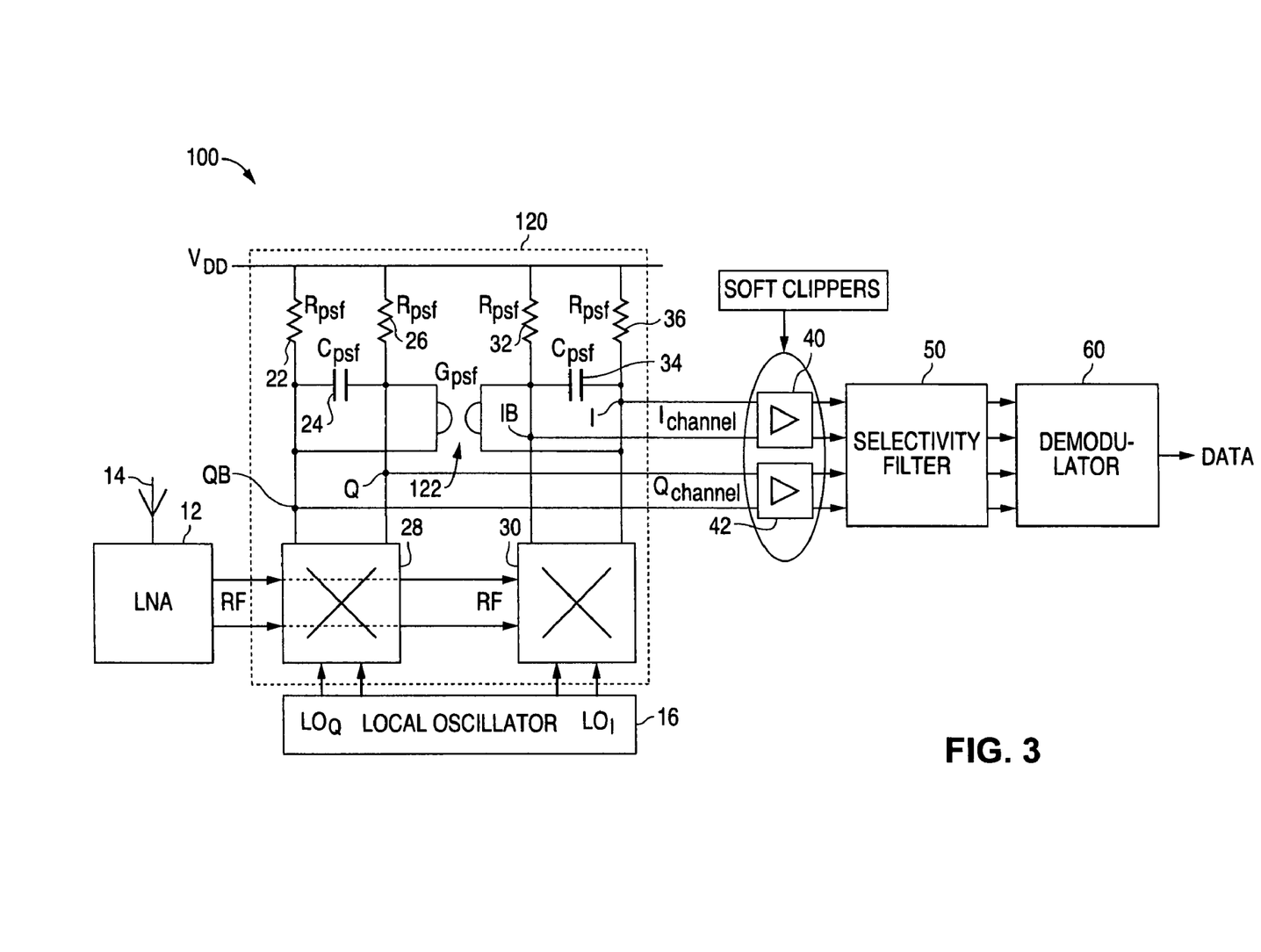
FIG. 3 is a functional block diagram illustrating an embodiment of a circuit having pre-selectivity filtering involving a gyrator.

FIG. 3 is a circuit diagram illustrating one exemplary embodiment of a receiver circuit 100 according to the present invention. In the circuit of FIG. 3, a gyrator circuit 122 is added to the quadrature mixer 120. See "Integration of Analog Filters in a Bipolar Process," J. O. Voorman, W. H. A. Brüls and P. J. Barth, IEEE Journal of Solid-State Circuits, Vol. SC-17, No. 4, August, 1982, for one example of a gyrator circuit. A gyrator is basically an impedance converter and is formed essentially by two anti-parallel arranged transconductors, one of which has a positive transconductance G and the other a negative transconductance −G.

In receiver 100, the preselectivity filter networks (e.g. resistors 22 and 26 with capacitor 24, resistors 32 and 34 along with capacitor 36) implement quadrature $R_{psf}$-$C_{psf}$ networks that work together with the gyrator action of gyrator 122, e.g. forming a gyrator resonator, to effectuate poly-phase filtering of the low-IF signal even before the low-IF signal enters the soft clippers 40 and 42. In this embodiment, active elements within the gyrator resonator 122 are benefiting to the same extent as the soft clippers and the poly-phase filters. By dimensioning the passive elements values $R_{psf}$, $C_{psf}$ and the gyrator constant $G_{psf}$, the filter center frequency and bandwidth can be set to fit the chosen low-IF receiver specification. Note that a first order filter is shown. Higher order filters may be implemented by adding one gyrator resonator and two resistive capacitor networks for each filter. For example, a fifth order filter would typically involve five gyrator resonators and ten RC networks.

Figure 4:
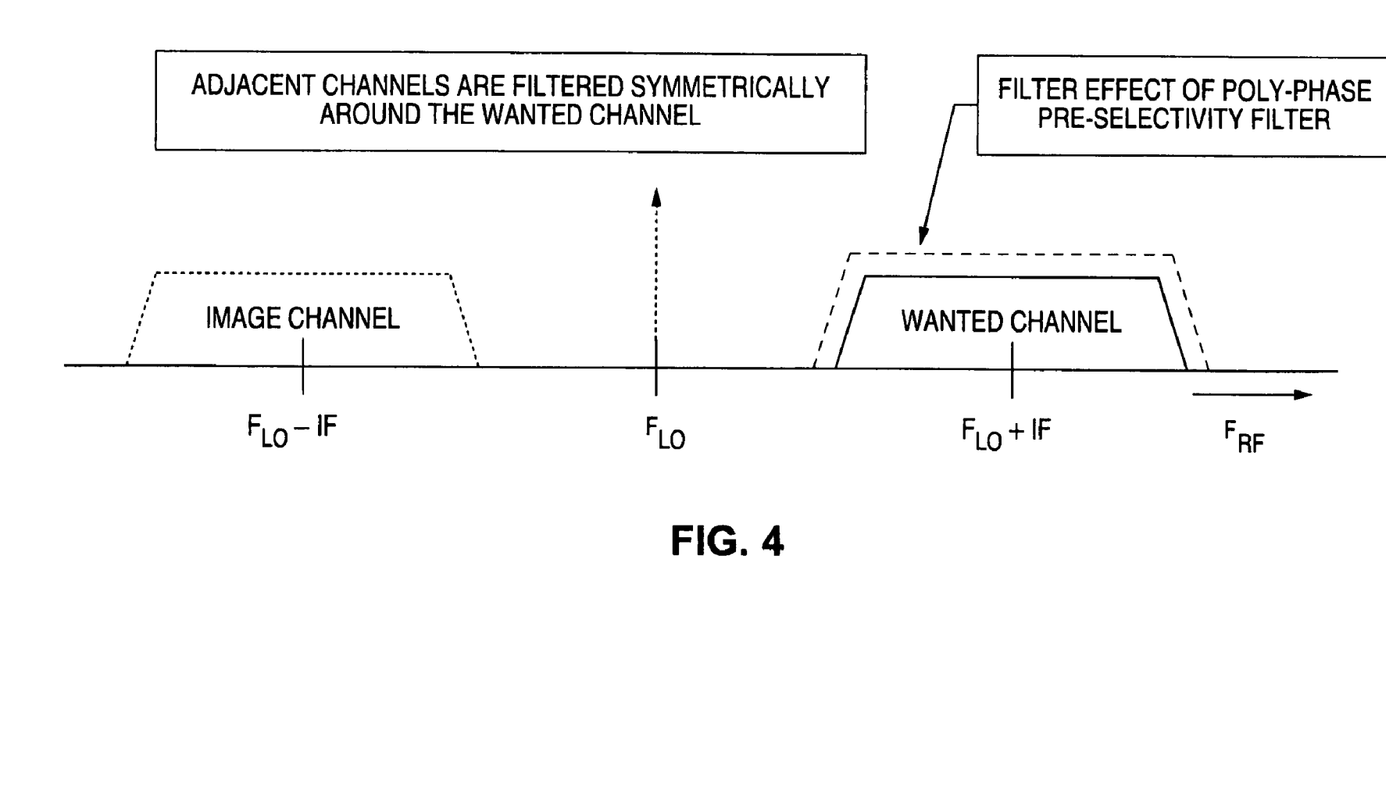
FIG. 4 is a frequency response diagram illustrating an example of a frequency response of the mixer and pre-selectivity filter circuit of FIG. 3.

Due to the improved filtering of the present invention, the dynamic range of the succeeding circuits, like the soft clippers and the poly-phase selectivity filter, can be relaxed. Power consumption and chip area can, therefore, be reduced. FIG. 4 is a frequency response diagram that illustrates the effectiveness of the poly-phase pre-selectivity filtering of the receiver 100 of FIG. 3. Since the frequency response of the poly-phase pre-selectivity filter is symmetrical around the wanted channel, it fully contributes to the receiver's channel selectivity. This means that one filter order can be omitted in the requirements for the design of the poly-phase selectivity filter, which, again, can result in an additional reduction of both power consumption and chip area. Furthermore, the resulting receive channel is substantially completely symmetrical allowing for improved overall channel selectivity filter design, reduced complexity and boosting receiver performance, while reducing second order distortion and inter-symbol interference.

Figure 5:
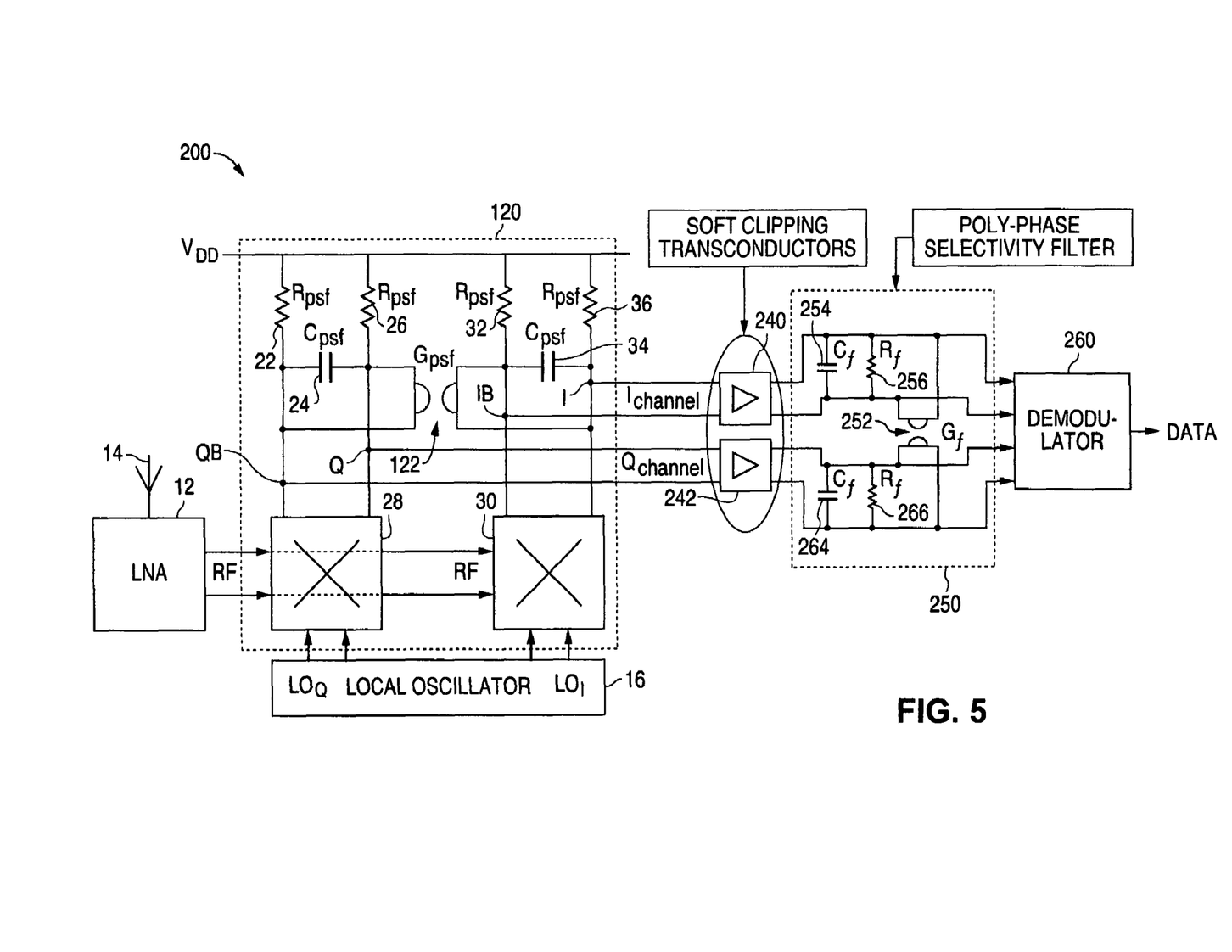
FIG. 5 is a functional block diagram illustrating an embodiment of a circuit having a matched gyrator selectivity filter.

FIG. 5 is a circuit diagram illustrating another embodiment of a low-IF receiver 200, wherein the poly-phase selectivity filter 250 is constructed with a gyrator resonator type poly-phase filter element 252. See Voorman et al. and U.S. Pat. No. 4,193,033 for examples of gyrator resonator elements, as well as FIG. 6. Device and layout matching is used between the poly-phase pre-selection filter 120 and the poly-phase selectivity filter 250 to obtain accurate and substantially temperature independent matching of center frequency and bandwidth.

In the embodiment of FIG. 5, the poly-phase selectivity filter 250 uses the same type of devices as the poly-phase pre-selectivity filter 120 and the soft clipping transconductors 240 and 242 use the same type of devices and topology as is used in the multipliers 28 and 30, e.g. bipolar differential pairs. Capacitor 254 and resistor 256 are coupled to the output of soft clipping transconductor 240 and implement a selectivity filter based on $R_fC_f$ for the I channel. Capacitor 264 and resistor 266 are coupled to the output of soft clipping transconductor 242 and implement a selectivity filter based on $R_fC_f$ for the Q channel. The $R_fC_f$ networks work together with the gyrator action of gyrator resonator 252 to effectuate poly-phase selectivity filtering of the low-IF signal. In this embodiment, the soft clippers 240 and 242 benefit from gyrator 122. The active element devices within the gyrator resonator 252 can be matched the active elements of the poly-phase pre-selectivity filter in quadrature mixer 120. By dimensioning the passive elements values $R_f$, $C_f$ and the gyrator constant $G_f$, the filter center frequency and bandwidth can be set to fit the chosen low-IF receiver specification.

In the circuit 200 of FIG. 5, only a first order poly-phase filter is shown. It will be evident to one of ordinary skill in the art that a plurality of gyrator resonator type poly phase elements can be applied to comply with substantially any selectivity filter specification without departing from the teachings of the present invention. Likewise, while the embodiments shown utilize a differential approach, the teachings of the present invention may be applicable to single-ended solutions without departing from the teachings of the present invention, as will be readily appreciated by one of ordinary skill in the art.

Figure 6:
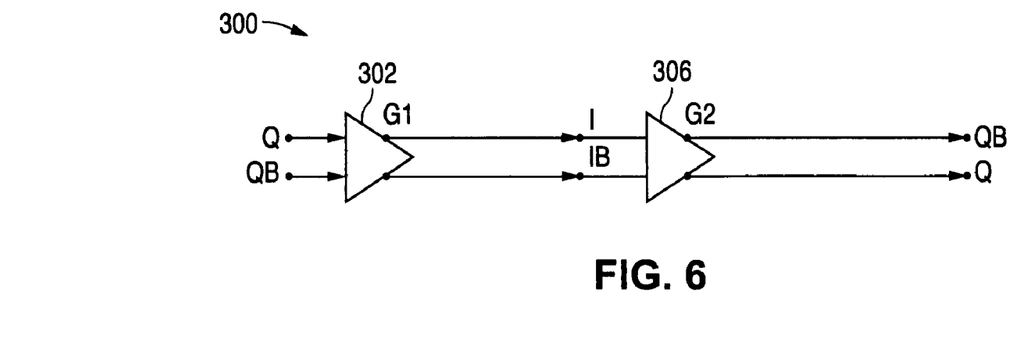
FIG. 6 is a functional block diagram illustrating an example of a differential gyrator circuit suitable for use in the circuits of FIGS. 3 and 5.

FIG. 6 shows one example of a differential gyrator resonator 300 suitable for use in the gyrator resonator circuit elements discussed above in FIGS. 3 and 5. In the gyrator resonator 300 of FIG. 6, transconductor amplifiers 302 and 306 (with transconductances G1 and G2, respectively) are coupled in anti-parallel fashion. The two transconductors 302 and 306, together with the capacitors 24 and 34, e.g. capacitance $C_{psf}$ in quadrature mixer 120, form a gyrator resonator within the quadrature mixer 120. The resonator is damped by the $R_{psf}$ resistors 22, 26, 32 and 36 to create the desired bandwidth. At the nodes I and IB, the capacitors connected at the nodes Q and QB are seen as inductances due to the gyrator principle and, at the nodes Q and QB, the capacitors connected at the nodes I and IB are seen as inductances, hence an LC-like parallel resonator is formed. The resonance frequency is determined by G1, G2, and $C_{psf}$. In the preferred embodiment, $G_{psf}$=G1=G2.

Similarly, the two transconductors 302 and 306, together with the capacitors 254 and 264, e.g. capacitance $C_f$ in poly-phase selectivity filter 250, form a gyrator resonator within the poly-phase selectivity filter 250. The resonator is damped by the $R_f$ resistors 256 and 266 to create the desired bandwidth.

In a preferred embodiment the resonator components including its values and layout are substantially symmetrical, e.g. the components driving the nodes I and IB are symmetrical with the components driving the nodes Q and QB. Furthermore, all transconductors have substantially the same dependencies, which means that their transconductances as a function of biasing, temperature, process spread, operating voltage, etc. are essentially the same. For further details regarding gyrator resonator circuits, see U.S. Patent Application No. 60/606,037 entitled "TUNABLE POLY-PHASE FILTER AND METHOD FOR CALIBRATION THEREOF" filed Aug. 31, 2004, herein incorporated by reference in its entirety for all purposes.

The center frequency of the poly-phase pre-selectivity filter within quadrature mixer 120 is determined by:

$$Fc_{psf} = \frac{G_{psf}}{2 \cdot \pi \cdot C_{psf}} \quad (1)$$

In the same way the center frequency of the poly-phase selectivity filter 250 is determined by:

$$Fc_f = \frac{G_f}{2 \cdot \pi \cdot C_f} \quad (2)$$

The bandwidth of the poly-phase pre-selectivity filter within quadrature mixer 120 is determined by:

$$Bw_{psf} = \frac{1}{\pi \cdot R_{psf} \cdot C_{psf}} \quad (3)$$

Likewise the bandwidth of the poly-phase selectivity filter 250 is determined by:

$$Bw_f = \frac{1}{\pi \cdot R_f \cdot C_f} \quad (4)$$

The matching properties of the preferred embodiment are also apparent from these equations.

It will be clear that a person skilled in the art can replace the resistors ($R_{psf}$ and $R_f$) by transconductors or transconductor-resistor combinations to create a tunable bandwidth without departing from the present invention.

In addition to the embodiments described above, a poly-phase demodulator 260 can be used that is matched to the pre-selectivity and the selectivity filters by using gyrator type resonators and/or oscillators. Device and layout matching is used between the poly-phase pre-selection filter in quadrature mixer 120, the poly-phase selectivity filter 250 and a poly-phase demodulator 260 to obtain accurate and substantially temperature independent matching of center frequency and bandwidth over the complete receiver chain.

Examples of such poly-phase demodulators 260 includes the differential slope FM demodulator of U.S. provisional application No. 60/668,922 entitled DIFFERENTIAL SLOPE FM DEMODULATOR FOR LOW-IF FREQUENCIES filed Apr. 6, 2005, herein incorporated by reference in their entirety for all purposes. Other examples include FM and AM phased-locked-loop (PLL) demodulators, wherein the voltage controlled oscillator (VCO) is constructed by a gyrator type resonator in oscillation mode. Another example is the quadrature demodulator shown in U.S. Pat. No. 5,341,107.

These are only examples and other types of demodulators may also be suitable for use with the present invention.

Figure 7:
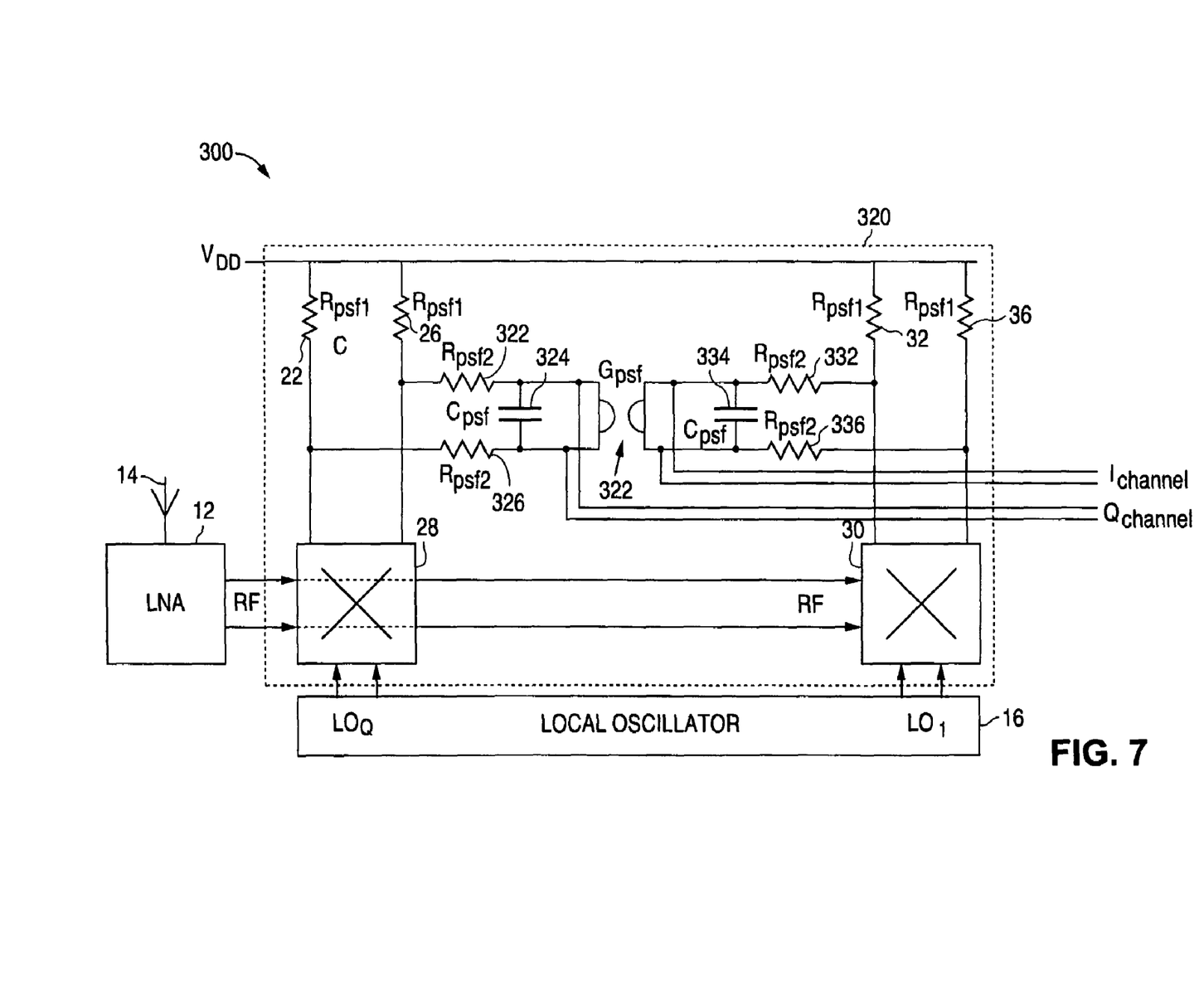
FIG. 7 is a functional block diagram illustrating another embodiment of a poly phase pre-selectivity filter.

FIG. 7 is a functional block diagram illustrating another embodiment of a poly phase pre-selectivity filter. In circuit 300, the preselectivity filter networks (e.g. resistors 22, 26, 322 and 326 with capacitor 324, resistors 32, 34, 332 and 336 along with capacitor 334) implement quadrature RC networks that work together with the gyrator action of gyrator 322, e.g. forming a gyrator resonator, to effectuate poly-phase filtering of the low-IF signal even before the low-IF signal enters, for example, the soft clippers 40 and 42 of FIG. 3. This embodiment permits the mixer function and the pre-selectivity filtering to be determined separately. Mixers 28 and 30 are mainly optimized by adjusting the value of $R_{psf1}$ for resistors 22, 26, 32 and 36. The pre-selectivity filter is primarily set by the value of $R_{psf2}$ for resistors 322, 326, 332 and 334. By dimensioning the passive elements values $R_{psf1}$, $R_{psf2}$, and $C_{psf}$ and the gyrator constant $G_{psf}$, the filter center frequency and bandwidth can be set to fit the chosen low-IF receiver specification and the mixer function may be fine tuned. Note that a first order filter is shown. Higher order filters may be implemented by adding one gyrator resonator and two resistive capacitor networks for each filter.

Also note that, in a preferred embodiment, the gyrator resonators of the pre-selectivity, selectivity and demodulator circuits are matched devices. As a result, when one gyrator resonator is aligned, the other gyrator resonators will also be aligned and the process compensation for one device typically compensates the other devices. In order to obtain this scenario the gyrator circuits and associated components, such as the RC networks, are matched.

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and similar referents in the context of describing the invention (especially in the context of the following claims) are to be construed to cover both the singular and the plural, unless otherwise indicated herein or clearly contradicted by context. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. It should be understood that the illustrated embodiments are exemplary only, and should not be taken as limiting the scope of the invention.

I claim:

1. A low intermediate frequency receiver circuit, the circuit comprising:
    an amplifier having an input for receiving a radio frequency signal and an output for outputting the received signal;
    a local oscillator having a first output for providing a first clock signal corresponding to a first channel of the received signal and a second output for providing second clock signal corresponding to a second channel of the received signal;
    a quadrature mixer has an input coupled to the output of the amplifier, a first clock input coupled to the first output of the local oscillator, and a second clock input coupled to the second output of the local oscillator, such that the received signal is input to the quadrature mixer along with the first and second clock signals and, responsive thereto, the quadrature mixer outputs the first channel signal at a first output and the second channel signal at a second output;

a pre-selectivity filter configured to filter at least an image signal and having a first resistive-capacitor network coupled to the first output of the quadrature mixer and a second resistive-capacitor network coupled to the second output of the quadrature mixer, where the first and second resistive-capacitor networks are coupled together through a first gyrator at the first and second outputs of the quadrature mixer to form a first gyrator resonator between the outputs of the quadrature mixer and the pre-selectivity filter, the pre-selectivity filter being configured to remove an image channel from the first and second channel signals;

a first amplitude limiter circuit having an input coupled to the first output of the quadrature mixer and an output;

a second amplitude limiter circuit having an input coupled to the second output of the quadrature mixer and an output;

a selectivity filter circuit having a first input coupled to the output of the first amplitude limiter circuit and a second input coupled to the output of the second amplitude limiter circuit and first and second outputs; and a demodulator having a first input coupled to the first output of the selectivity filter circuit and a second input coupled to the second output of the selectivity filter circuit, and an output.

2. The low intermediate frequency receiver circuit of claim 1, where the selectivity filter further comprises a poly-phase selectivity filter having a third resistive-capacitor network coupled to the first output of the selectivity filter and a fourth resistive-capacitor network coupled to the second output of the selectivity filter, where the third and fourth resistive-capacitor networks are coupled together through a second gyrator to form a second gyrator resonator.

3. The low intermediate frequency receiver circuit of claim 2, where the first and second amplitude limiters further comprise first and second soft clippers that include transconductor devices.

4. The low intermediate frequency receiver circuit of claim 3, where the first and second gyrators and the soft clippers utilize bipolar transconductor devices.

5. The low intermediate frequency receiver circuit of claim 3, where the first and second gyrators and the soft clippers utilize metal oxide semiconductor transconductor devices.

6. The low intermediate frequency receiver circuit of claim 3, where the first and second gyrators and the soft clippers include matched transconductor devices.

7. A low intermediate frequency receiver circuit, the circuit comprising:
    an amplifier having an input for receiving a radio frequency signal and an output for outputting the received signal;
    a local oscillator having a first output for providing a first clock signal corresponding to a first channel of the received signal and a second output for providing second clock signal corresponding to a second channel of the received signal;
    a quadrature mixer has an input coupled to the output of the amplifier, a first clock input coupled to the first output of the local oscillator, and a second clock input coupled to the second output of the local oscillator, such that the received signal is input to the quadrature mixer along with the first and second clock signals and, responsive thereto, the quadrature mixer outputs the first channel signal at a first output and the second channel signal at a second output;

a pre-selectivity filter having a first resistive-capacitor network coupled to the first output of the quadrature mixer and a second resistive-capacitor network coupled to the second output of the quadrature mixer, where the first and second resistive-capacitor networks are coupled together through a first gyrator to form a first gyrator resonator, the pre-selectivity filter being configured to remove an image channel from the first and second channel signals;
    a first amplitude limiter circuit having an input coupled to the first output of the quadrature mixer and an output;
    a second amplitude limiter circuit having an input coupled to the second output of the quadrature mixer and an output;
    a selectively filter circuit having a first input coupled to the output of the first amplitude limiter circuit and a second input coupled to the output of the second amplitude limiter circuit and first and second outputs; and
    a demodulator having a first input coupled to the first output of the selectivity filter circuit and a second input coupled to the second output of the selectivity filter circuit, and an output;
    where the selectivity filter further comprises a poly-phase selectivity filter having a third resistive-capacitor network coupled to the first output of the selectivity filter and a fourth resistive-capacitor network coupled to the second output of the selectivity filter, where the third and fourth resistive-capacitor networks are coupled together through a second gyrator to form a second gyrator resonator; and
    where the demodulator further comprises a poly-phase demodulator having third and fourth gyrator resonators.

8. The low intermediate frequency receiver circuit of claim 7, where of the first, second, third and fourth gyrators include matched transconductor devices.

9. The low intermediate frequency receiver circuit of claim 7, where the first and second amplitude limiters further comprise first and second soft clippers that include transconductor devices and the first, second and third gyrators and the soft clippers utilize matched transconductor devices.

10. The low intermediate frequency receiver circuit of claim 1, where the quadrature mixer further comprises:
    an I channel mixer having an input coupled to the output of the amplifier, a clock input coupled to the first output of the local oscillator, and an output coupled to the first output of the quadrature mixer;
    a Q channel mixer having an input coupled to the output of the amplifier, a clock input coupled to the second output of the local oscillator, and an output coupled to the second output of the quadrature mixer; and
    where the first resistive-capacitor network of the pre-selectivity filter is coupled to the output of the I channel mixer, the second resistive-capacitor network coupled to the output of the Q channel mixer, and the first gyrator is coupled between the output of the I channel mixer and the output of the Q channel mixer.

11. A method for receiving a radio frequency signal, the method comprising the steps of:
    receiving and amplifying the radio frequency signal to produce a received signal;
    generating first and second clock signals, where the first clock signal corresponds to a first channel of the received signal and the second clock signal corresponds to a second channel of the received signal;
    multiplying the received signal with the first and second clock signals to obtain the first and second channel signals;

performing pre-selectivity filtering of the received signal to filter at least an image signal by filtering the first channel using a first impedance, filtering the second channel using a second impedance, and converting the first and second impedances with respect to one another through a first gyrator that is coupled between the first and second channel signals and the first and second impedances;

amplitude limiting the first and second channels to obtain first and second amplitude limited channels;

selectivity filtering the first and second amplitude limited channels to obtain first and second selectivity filtered channels; and demodulating the first and second selectivity filtered channels to obtain a data signal.

12. The method of claim 11, where the step of performing selectivity filtering of the first and second amplitude limited channels to obtain first and second selectivity filtered channels includes the steps of:

filtering the first soft clipped channel using a third impedance;

filtering the second soft clipped channel using a fourth impedance; and converting the third and fourth impedances with respect to one another through a second gyrator.

13. The method of claim 12, where the step of amplitude limiting the first and second channels to obtain first and second amplitude limited channels further comprises transconductively clipping the first and second channels to obtain the first and second amplitude limited channels.

14. The method of claim 13, where the steps of performing pre-selectivity filtering of the received signal, amplitude limiting the first and second channels, and performing poly-phase selectivity filtering of the first and second amplitude limited channels each involve using transconductance devices.

15. The method of claim 14, where the transconductance devices further comprise differential bipolar devices.

16. The method of claim 14, where the step of demodulating the first and second selectivity filtered channels to obtain a data signal further comprises poly-phase demodulating the first and second selectivity filtered channels to obtain the data signal.

17. A system for receiving a radio frequency signal, the system comprising:

means for receiving and amplifying the radio frequency signal to produce a received signal;

means for generating first and second clock signals, where the first clock signal corresponds to a first channel of the received signal and the second clock signal corresponds to a second channel of the received signal;

means for multiplying the received signal with the first and second clock signals to obtain the first and second channel signals;

means for performing pre-selectivity filtering of the received signal to filter at least an image signal by filtering the first channel using a first impedance, filtering the second channel using a second impedance, and converting the first and second impedances with respect to one another through a first gyrator that is coupled between the means for multiplying the received signal with the first and second clock signals and the means for performing pre-selectivity filtering of the received signal;

means for amplitude limiting the first and second channels to obtain first and second amplitude limited channels;

means for selectivity filtering the first and second soft clipped channels to obtain first and second selectivity filtered channels; and means for demodulating the first and second selectivity filtered channels to obtain a data signal.

18. The system for receiving a radio frequency signal of claim 17, where the means for selectivity filtering the first and second soft clipped channels to obtain first and second selectivity filtered channels further comprises filtering the first soft clipped channel using a third impedance, filtering the second soft clipped channel using a fourth impedance, and converting the third and fourth impedances with respect to one another through a second gyrator.

19. The system for receiving a radio frequency signal of claim 1, wherein the quadrature mixer outputs the first channel signal at a first differential output and the second channel signal at a second differential output; wherein the first resistive-capacitor network of the pre-electivity filter is differentially coupled to the first differential output of the quadrature mixer and the second resistive-capacitor network of the pre-selectivity filter is differentially coupled to the second differential output of the quadrature mixer; and wherein the first and second resistive- capacitor networks are differentially coupled together through the first gyrator to form the first gyrator resonator.

20. The system for receiving a radio frequency signal of claim 7, wherein the quadrature mixer outputs the first channel signal at a first differential output and the second channel signal at a second differential output; wherein the first resistive-capacitor network of the pre-electivity filter is differentially coupled to the first differential output of the quadrature mixer and the second resistive-capacitor network of the pre-selectivity filter is differentially coupled to the second differential output of the quadrature mixer; and wherein the first and second resistive- capacitor networks are differentially coupled together through the first gyrator to form the first gyrator resonator.

21. The method of claim 11, further comprising performing differential pre-selectivity filtering of the received signal to filter at least an image signal by differentially filtering the first channel using a first impedance, differentially filtering the second channel using a second impedance, and differentially converting the first and second impedances with respect to one another through the first gyrator.

22. The system for receiving a radio frequency signal of claim 17, wherein the means for performing pre-selectivity filtering of the received signal to filter at least an image signal comprises a means for differentially filtering the first channel using a first impedance, differentially filtering the second channel using a second impedance, and differentially converting the first and second impedances with respect to one another through the first gyrator.

* * * * *